United States Patent [19]

Tavrow et al.

[11] Patent Number: 5,402,386
[45] Date of Patent: Mar. 28, 1995

[54] WORD LINE DECODER/DRIVER CIRCUIT AND METHOD

[75] Inventors: Lee S. Tavrow; Mark R. Santoro, both of Sunnyvale; Gary W. Bewick, Palo Alto, all of Calif.

[73] Assignee: Sun Microsystems, Inc., Mountain View, Calif.

[21] Appl. No.: 91,948

[22] Filed: Jul. 15, 1993

Related U.S. Application Data

[63] Continuation-in-part of Ser. No. 960,616, Oct. 14, 1992.

[51] Int. Cl.[6] ............................................. G11C 11/40
[52] U.S. Cl. ......................... 365/230.06; 365/230.03; 326/105; 326/84
[58] Field of Search ............... 307/445, 449, 463, 467; 365/230.06, 230.03

[56] References Cited

U.S. PATENT DOCUMENTS

| | | | |
|---|---|---|---|
| 4,369,503 | 1/1983 | Isogai | 365/230.06 |
| 4,730,275 | 3/1988 | Baskett | 365/155 |
| 5,103,113 | 4/1992 | Inui et al. | 307/449 |

OTHER PUBLICATIONS

"An Experimental Soft-Error Immune 64-Kb 3ns ECL Bipolar RAM" by Yamaguchi et al., IEEE 1988 Bipolar Circuits & Technology Meeting.

"A 1.5-ns Access Time, 78-um² Memory-Cell Size, 64-kb ECL-CMOS SRAM" by Yamaguchi et al., IEEE Journal of Solid-State Circuits.

"Bipolar and MOS Analog Integrated Circuit Design" by Alan B. Grebene, 1984.

*Primary Examiner*—Eugene R. LaRoche
*Assistant Examiner*—F. Niranjan
*Attorney, Agent, or Firm*—James W. Rose

[57] ABSTRACT

A row select circuit for semiconductor memories is disclosed. The row select circuit includes a decoder portion and a driver portion. The decoder potion of the row select circuit includes a plurality of decoder circuits, each servicing a multiplicity of rows. Two levels of decoding are used to select a row. First, one of the plurality of decoder circuits is selected. Second, a predecoder is provided for simultaneously selecting one of the multiplicity of rows serviced by the selected decoder circuit. A single current source is used to service the multiplicity of rows associated with a particular decoder. The driver portion of the circuit includes a driver circuit for each row. Each driver includes an inverter stage, a driver stage, a clamp and a voltage reference circuit. For a selected row, the driver circuit provides ultra-fast access time. For the deselected rows, the driver circuit consumes minimal power.

34 Claims, 5 Drawing Sheets

WORD LINE DECODER/DRIVER CIRCUIT AND METHOD

CROSS-REFERENCE TO RELATED APPLICATION

This is a continuation-in-part application of pending U.S. patent application Ser. No. 07/960,616, entitled "Random Access Memory Design", filed Oct. 14, 1992.

BACKGROUND OF THE INVENTION

1. Field of the Invention

The present invention relates to semiconductor memories, and, more particularly, to a high speed row select circuit and method.

2. Description of the Prior Art

A row select circuit is used in memory arrays. An array with ($2^N$) rows requires an address input of (N) bits to select a row. The row select circuit typically includes a decoder circuit and a driver circuit for each row in the array. Each decoder receives and deciphers the (N) bit address input, and in response thereto, one row in the array is selected. The driver circuit of the selected row drives the selected row, thus allowing a memory cell or cells on the selected row to be accessed (read or written into). All of the other rows in the array are deselected. For certain applications such as cache memory on a microprocessor chip, fast access times are desired.

A prior art row select circuit is described in the article entitled "A 1.5-ns Access Time, 78-um2 Memory-Cell Size, 64-kb ECL-CMOS SRAM", IEEE Journal of Solid State Circuits, Vol. 27, No. 2, February, 1992, by Yamaguchi et al. This article teaches a row select circuit (FIG. 3B) using a common emitter coupled logic (ECL) NOR gate configuration. On the first side of the ECL differential configuration, two transistors (Q1 and Q2) are arranged in a NOR gate arrangement. The collectors of the NOR gate transistors are coupled together at a node (hereafter referred to as the "switching node"). The switching node is coupled to a power rail through a pull up resistor. The switching node is used to drive the ECL word line driver transistor Qw. On the second side of the ECL differential configuration, a third transistor is provided with its gate coupled to a reference voltage VBB. The transistors of the differential configuration share a current source coupled to the emitters of the three transistors.

Prior to being selected, Q1 and Q2 are turned on, and the switching node is pulled down. During row select operation, the address signals applied to Q1 and Q2 both go true (low), and as a result, the transistors turn off. The switching node is pulled up though the resistor, Qw is turned on, and the row is selected.

This aforementioned row select circuit has several disadvantages. The multiple transistors of the NOR decoder create a large amount of capacitance at the switching node. When the NOR gate transistors are turned off, indicating the selection of the row, the capacitance at the switching node slows down the rate at which the node can be pulled up. As a result, access of the row is delayed. Another disadvantage is that the circuit consumes a large amount of power. Each row in the memory array includes a dedicated current source. The current source dissipates power regardless of whether the row is selected or not, and therefore, limits the size of the memory array for a given power budget.

A prior art row driver circuit is described in the Article entitled "An Experimental Soft-Error Immune 64-Kb 3ns Bipolar Ram", Kunihiko Yamaguchi et al., IEEE Bipolar Circuits and Technology Meeting, 1988. This article teaches a two stage Darlington driver circuit (FIG. 2). In response to a row select signal, the two cascaded transistors amplify the current of the row select signal and pull up the selected row. A first discharge circuit is coupled at an intermediate node between the two cascaded transistors. A second discharge circuit is coupled to the output of the second stage of the Darlington (the node which drives the row). A resistor is coupled between the first discharge circuit and the second discharge circuit.

The aforementioned driver circuit has several disadvantages. The two discharge circuits each include a constant current source. These two current sources dissipate power, regardless of whether the row is selected or deselected. Accordingly, the size of a memory array is limited for a given power budget. Although not stated in the Article, it is believed the purpose of the resistor is to shunt current from the intermediate node to the second discharge path. This reduces the overshoot (bounce) of the Darlington configuration. The resistor, however, impairs the speed performance of the driver circuit because it is always shunting current, even when no overshoot condition is present in the driver circuit. Another disadvantage of the circuit is that the gain of the Darlington is process dependent, i.e., the gain of the transistors are subject to process variations.

SUMMARY OF THE INVENTION

The present invention discloses a row select circuit for a memory array. The row select circuit includes a number of novel features that provide superior speed performance and reduced power consumption, not possible with prior art circuits. The row select circuit includes a decoder portion and a driver portion.

The Decoder Portion

The decoder portion of the row select circuit includes a plurality of decoder circuits, each servicing a multiplicity of rows. Two simultaneous levels of decoding are used to select a row. First, one of the plurality of decoder circuits is selected. Second, a predecoder is provided for selecting one of the multiplicity of rows serviced by the selected decoder circuit.

Each decoder circuit includes a first transistor and a second transistor arranged in a differential pair, a single constant current source, a logic circuit, and a multiplicity of rows. Each row has a row select transistor, a pull up transistor, and a switching node. A single predecoder is shared across the plurality of decoder circuits.

In each decoder, the first transistor and the second transistor of the differential pair have their emitters coupled to the single current source. The first transistor has its base coupled to a reference voltage. The second transistor has its base coupled to the output of the decoder logic circuit. Each row select transistor has its emitter-collector current path coupled between a pull up resistor and the collector of the first transistor. The bases of the multiplicity of row select transistors are selectively activated by the predecoder.

During the row select operation, one of the plurality of decoder circuits is selected. Selection of a particular decoder occurs when a first subset address signal causes the output of the logic circuit to be true (low). The second differential transistor, responsive to the true signal from the decoder logic circuit, is turned off, and current from the current source is steered through the first transistor of the differential pair. Simultaneously, in response to a second subset of address signals, the predecoder selects a row serviced by the particular decoder circuit by activating one of the multiplicity of row select transistors. A current path is thus established between the single current source associated with the particular decoder circuit, through the emitter-collector path of the first transistor, the emitter-collector path of the activated row select transistor, and finally the pull up resistor associated with the selected row. As a result, the switching node of the selected row is pulled down, indicating the selection of the row.

The decoder arrangement of the present invention provides many advantages. The switching node for each row is moved to the side of the differential pair opposite the decoder-logic, thereby substantially reducing the delays due to capacitance. The predecoder, which selects one of the multiplicity of rows, allows the multiple rows to be serviced by a single current source. This significantly reduces power consumption of the memory array because fewer current sources are required.

The Driver Portion

Each row in the array is serviced by a driver circuit, which is used to drive the row in the event it is selected. The driver circuit for each row includes an inverting stage, a driver stage with an over-shoot clamp, and a Vss generator. The various stages of the driver circuit work together to speed up access time when the row is selected.

For the selected row, the inverting stage inverts the low potential signal at the switching node to a high potential. The driver stage includes several transistors arranged in a cascaded emitter follower configuration. The cascaded emitter-follower transistors greatly amplify the current of the inverted row selected signal which pulls up the selected row faster than previously possible with prior art driver circuits. The clamp of the presentation switches on only during overshoot conditions. Thus, the clamp does not reduce the gain of the driver stage during normal operation and provides superior performance than the prior art driver circuit.

In addition to the exceptionally fast access times, the driver stage 50 also has a number of other innovative features. These features include tailoring the amount of current gain of the driver circuit, making the current gain of the driver circuit substantially process independent, and providing discharge paths for rapidly discharging the row after access.

The various stages of the driver circuit also work together to minimize power dissipation when the row is deselected. For deselected rows, the inverter inverts the high potential at the switching node of the deselected row to a lower threshold voltage established by the Vss generator. The potential of Vss is set to equal the voltage drop across the cascaded emitter follower configuration of the driver stage. Thus, the potential at the output node of the driver stage coupled to the deselected row is approximately equal to zero. The Vss generator is a current mirror to the driver stage. The current mirror ensures that the current and voltage at the deselected row remains approximately zero, even in the event of process, temperature and voltage variations. Furthermore, the clamp circuit of a deselected row burns no current. The DC power dissipation at the deselected rows is therefore negligible.

The row select circuit of the present invention provides numerous advantages. The circuit provides ultra-fast row access time. The amount of current dissipated by the circuit, given the fast access time, is minimal. These two advantages mean for a given power budget, a circuit designer has the ability to design a larger memory array with a faster access time than previously possible with the prior art decoder/driver circuits. Finally, the row select circuit is scalable. The row select technique can be readily adapted for memory arrays of larger sizes (i.e., 16K, 64K, etc.) because of the reduced power consumption. Thus, the row select circuit of the present invention is particularly well suited for any high speed SRAM, such as cache memory on a microprocessor chip.

DESCRIPTION OF THE DRAWINGS

The objects, features and advantages of the present invention will be apparent from the following description in which.

DESCRIPTION OF THE PREFERRED EMBODIMENT

Figure 1:
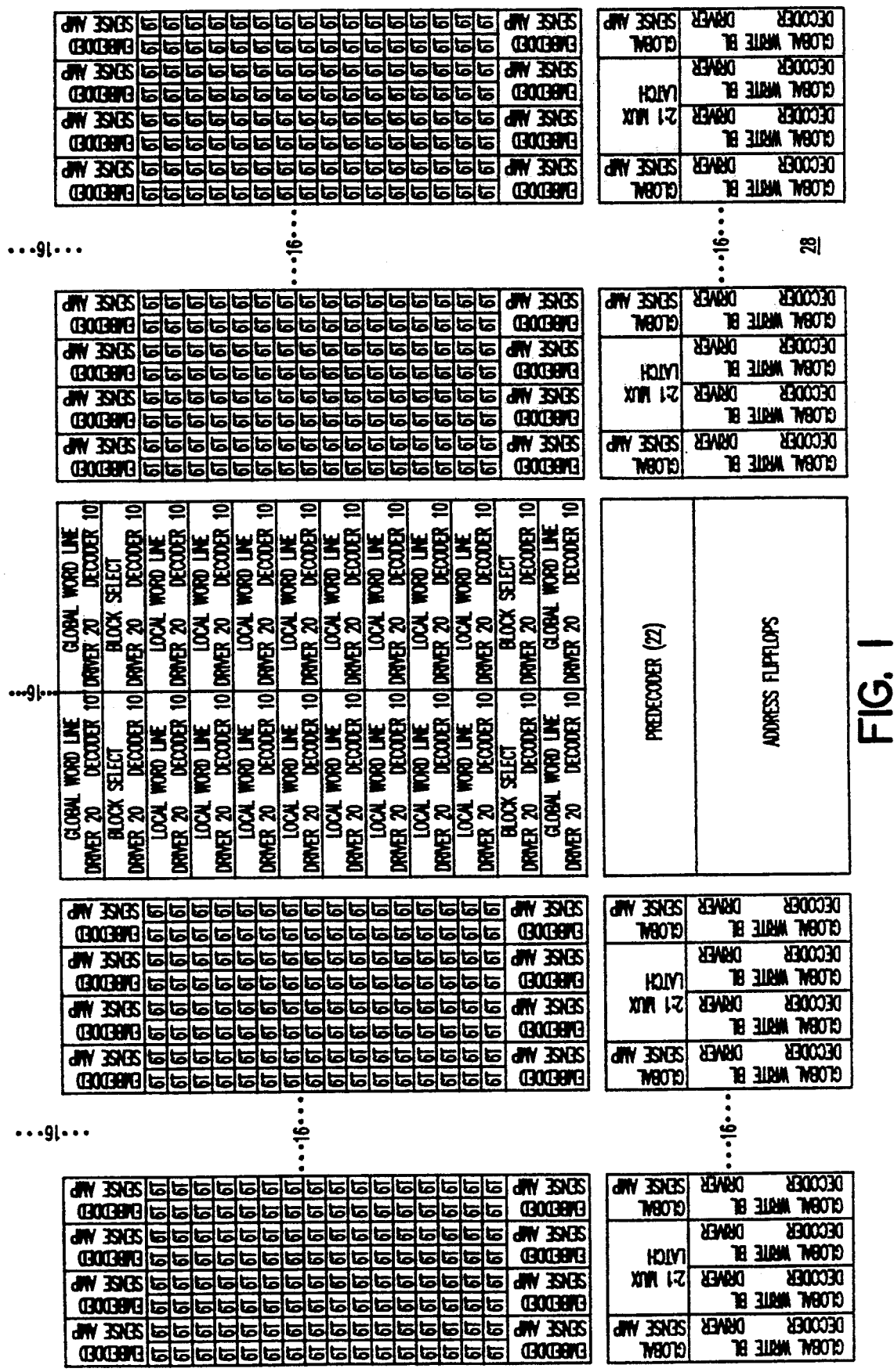
FIG. 1 illustrates a block diagram of an EAT memory array of the present invention.

Referring to FIG. 1, a block diagram of an Embedded Access Tree (EAT) memory array is shown. The EAT memory disclosed in the aforementioned parent application is incorporated by reference herein. In summary, the EAT memory is an 8K byte SRAM intended for use as a first level cache on a semiconductor die containing a microprocessor unit. In a preferred embodiment, the array includes two hundred and fifty six columns and two hundred and fifty six rows $R_{(1)}$–$R_{(256)}$ of memory cells. The rows are divided into blocks of sixteen (16) rows. Of particular importance to the present invention are the elements labeled "Decoder" 10, "Driver" 20, "Predecoder" 22.

Row Select Block Diagram

Figure 2:
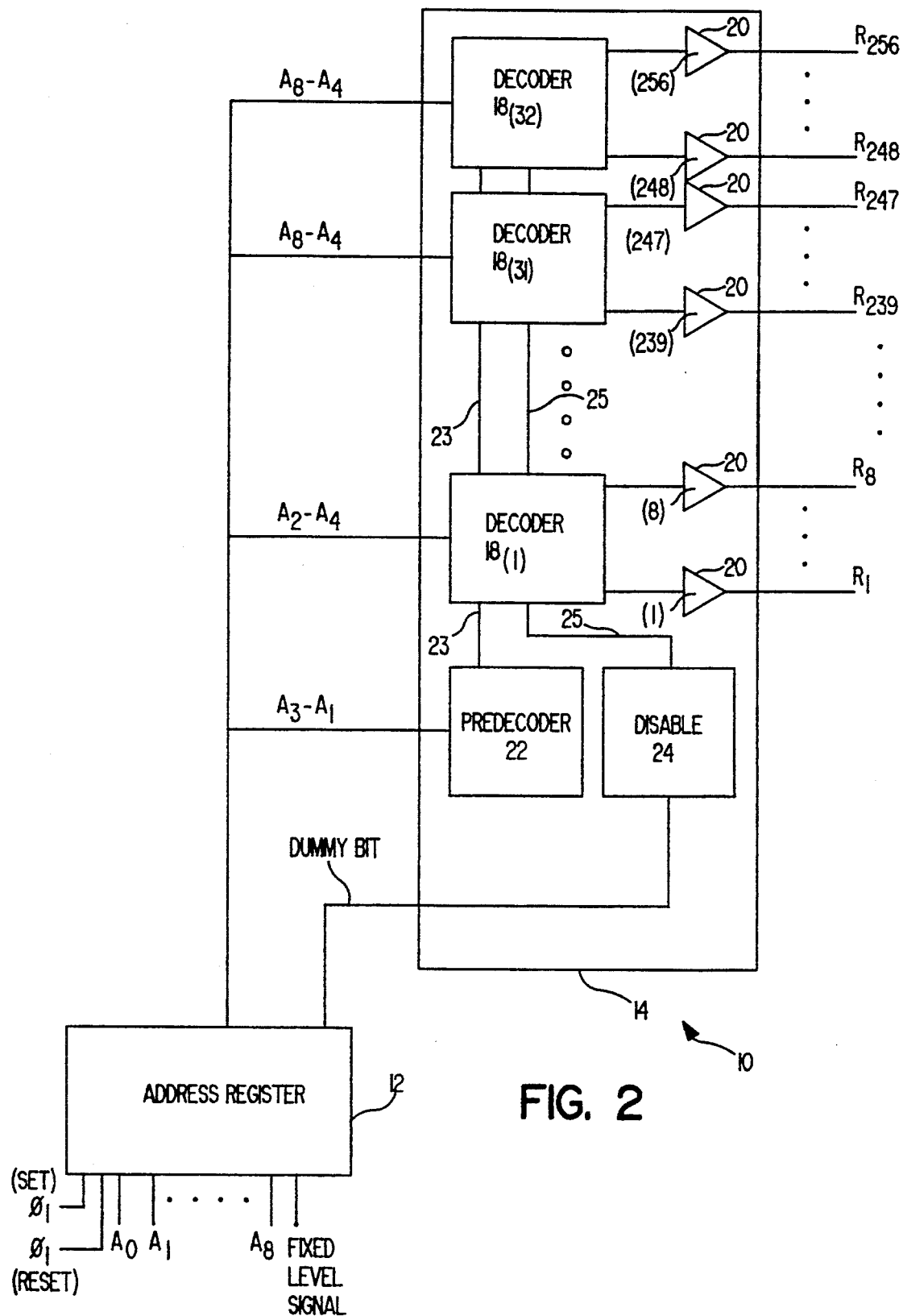
FIG. 2 illustrates a block diagram of a row select circuit of the present invention.

Referring to FIG. 2, a block diagram of the row select circuit of the present invention is shown. The row select circuit 10 includes an address register bank 12 and a decoder/driver circuit 14. The register bank 12 includes eight (8) registers (not shown), one for each address signal $A_1$–$A_8$ respectively and a ninth "dummy" register for receiving a fixed level signal (high).

The decoder/driver 14 includes a total of thirty two (32) decoder circuits $18_{(1)}$–$18_{(32)}$ and two hundred and fifty six (256) driver circuits $20_{(1)}$–$20_{(256)}$. A driver circuit $20_{(1)}$–$20_{(256)}$ is associated with each row $R_{(1)}$–$R_{(256)}$ respectively in the memory array. Each decoder 18 services eight (8) rows. For example, rows $R_{(1)}$–$R_{(8)}$ are serviced by decoder $18_{(1)}$, rows $R_{(9)}$–$R_{(16)}$ are serviced by decoder $18_{(2)}$, and so forth, for all the rows R, including rows $R_{(249)}$ through $R_{(256)}$, which are serviced by the last decoder $18_{(32)}$. Thus, there are two (2) decoder circuits for each block in the EAT memory.

The decoder/driver circuit 14 further includes a predecoder 22 which is shared across the plurality of decoder circuit $18_{(1)}$–$18_{(32)}$. The predecoder 22 has eight (8) output signals 23 which are applied to the decoder circuits $18_{(1)}$–$18_{(32)}$ respectively. The eight (8) output signals 23 of predecoder 22 correspond to the eight (8) rows serviced by each decoder 18 respectively.

The decoder/driver circuit 14 also includes a disable circuit 24, which receives a dummy bit from the dummy register in register bank 12. The output 25 of the disable circuit 24 delays the arrival of the dummy bit to the decoders $18_{(1)}$–$18_{(32)}$. The delay is approximately equal to the time required for the predecoder 22 to resolve, i.e., develop its selection.

The row select circuit 10 is driven by two (2) clock signals, the set clock pulse $\phi_1$ and the reset clock pulse $\phi_2$. Row selection occurs with the set clock pulse $\phi_1$. After an appropriate row access time, the reset clock pulse $\phi_2$ occurs, and the row select circuit 10 is reset in preparation for the next row select operation.

With the occurrence of set clock pulse $\phi_1$, the address register 12 generates sixteen (16) signal s $A_1$–$A_8$ (and their complements) respectively. All of the decoders $18_{(1)}$–$18_{(32)}$ receive a first subset of the address signals $A_4$–$A_8$ (and their complements) and select a particular decoder $18_{(i)}$. Simultaneously, the predecoder 22 selects one (1) of its eight (8) output signals 23 in response to a second subset of address signals $A_1$–$A_3$. A specific row $R_{(i)}$ in the particular decoder $18_{(i)}$ is thus selected. The selected row $R_{(i)}$ is driven by its corresponding driver $20_{(i)}$. All the other rows in the memory array are deselected. During row select, the dummy register sets the dummy bit low. This prevents the disable circuit 24 from interfering with the normal selection of a row.

During reset, the address register signals $A_1$–$A_8$ (and their complements) are all driven high. This ensures that all decoders $18_{(1)}$–$18_{(32)}$ and the predecoder 22 outputs are invalid and all the rows are deselected. The dummy register also resets the dummy bit high. The reset dummy bit activates the disable circuit 24 and prevents the spurious selection of any row in the memory array.

The Decoder Circuit

Figure 3:
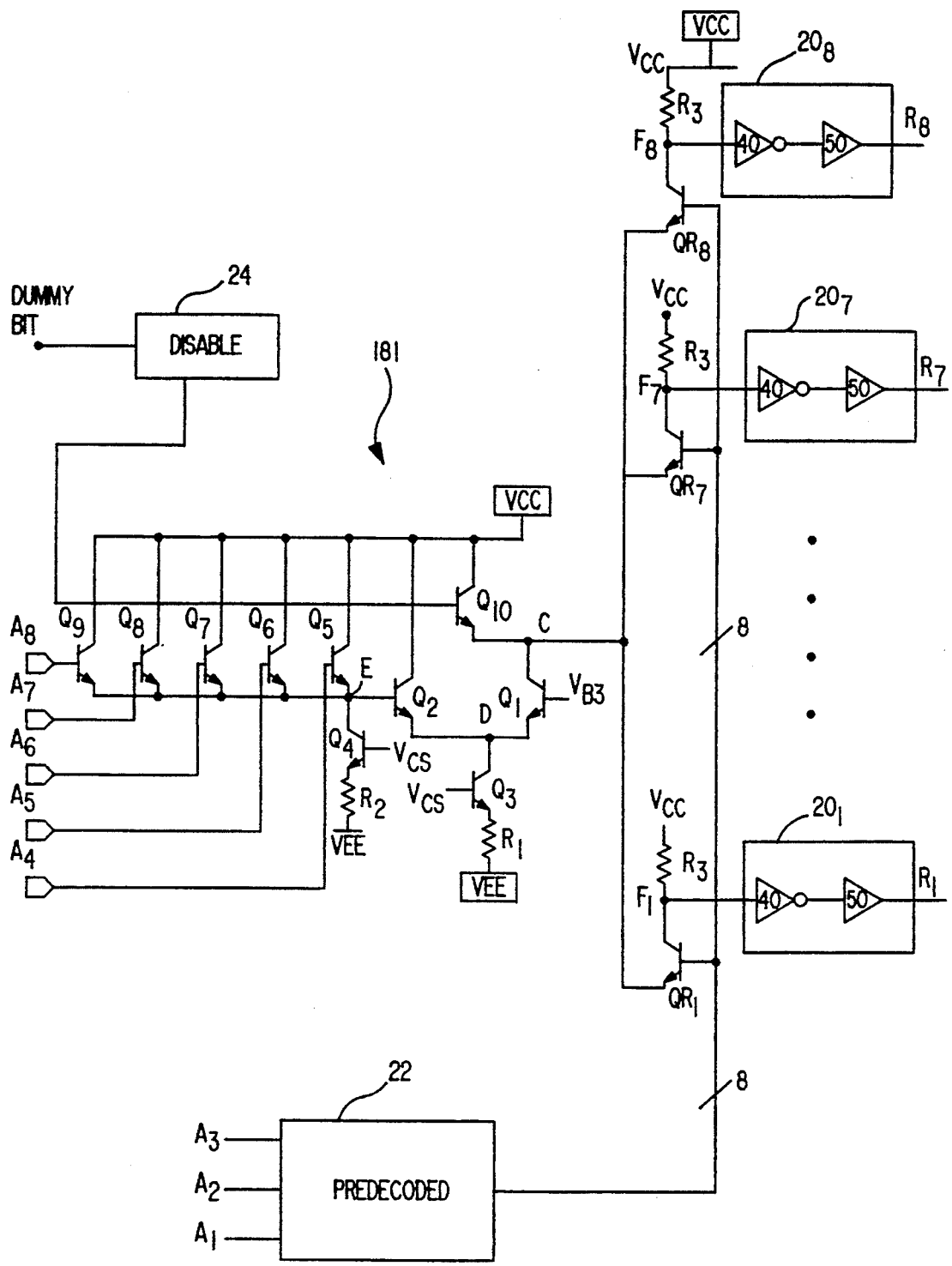
FIG. 3 illustrates a circuit schematic of a decoder of the present invention.

Referring to FIG. 3, a schematic of the decoder circuit $18_{(1)}$, for example, is illustrated. The decoder circuit $18_{(1)}$ includes differential transistors Q1 and Q2, pull down transistors Q3 and Q4, and resistors R1 and R2. Q3 and R1 provide a constant current source for the differential transistors Q1 and Q2. A five-input OR logic gate including five (5) transistors Q5, Q6, Q7, Q8 and Q9 is provided on the Q2 side of the differential pair. A current steering node C is provided on the Q1 side of the differential pair. The decoder circuit $18_{(i)}$ also includes disable transistor Q10. The rows $R_{(1)}$–$R_{(8)}$ serviced by the decoder $18_{(1)}$ include row select transistors $QR_{(1)}$–$QR_{(8)}$, row switching nodes $F_{(1)}$–$F_{(8)}$, and resistors R3 respectively.

Q1 has its base coupled to reference voltage Vb3, its collector coupled to node C, and its emitter coupled to node D. Q2 has its base coupled to node E, its collector coupled to reference voltage Vcc, and its emitter coupled to node D. Q3 has its base coupled to reference voltage Vcs, its collector coupled to node D, and its emitter coupled to Vee through resistor R1. Q4 has its base coupled to Vcs, its collector coupled to node E, and its emitter coupled to Vee through R2. Q10 has its base coupled to the output of the disable circuit 24, its collector coupled to Vcc, and its emitter coupled to node C.

Q5, Q6, Q7, Q8, and Q9 have their bases coupled to a unique combination of address signals $A_8$–$A_4$ or their complements, respectively. The collectors of the transistors Q5–Q9 are coupled to reference voltage Vcc, and the emitters are coupled to node E respectively. Node E is considered the output of the OR function defined by transistors Q5–Q9.

The remaining thirty one (31) decoder circuits $18_{(2)}$–$18_{(32)}$ are the same as $18_{(1)}$, except their decoder logic inputs are all coupled to a different combination of address signals $A_8$–$A_4$ and their complements. As a result, for any given address input, only one (1) of the thirty two (32) decoders is selected. Since the manner in which the decoders are coupled to the address register outputs is well known, it is not described in detail herein.

The collectors of each of the row select $QR_1$–$QR_8$ transistors are coupled to Vcc through pull up resistors R3 respectively. The emitters of transistors $QR_1$–$QR_8$ are each coupled to current steering node C. Transistors $QR_1$–$QR_8$ have their bases coupled to the eight (8) outputs of the predecoder 22 respectively.

During reset of the decoder circuit 18, the dummy bit is reset to high (true) by the dummy register. The reset bit, through the disable circuit 24, turns on Q10 of each decoder $18_{(1)}$–$18_{(32)}$ respectively. As a result, in each decoder $18_{(1)}$–$18_{(32)}$, a current path is established from the current source established by Q3 and R1, through Q1, node C, and Q 10 to Vcc. This current path is necessary because during reset, all of the outputs of predecoder 22 are false. The current from current source (Q3 and R1) is steered through Q10, preventing spurious conduction through any of the row select transistors QR1–QR8 prior to the valid selection of a row by predecoder 22.

The operation of the row select circuit 14 in the selection of a row $R_{(i)}$ in response to a given address $A_1$–$A_8$ is now described. For the purposes of illustration, the selection of row $R_{(7)}$ associated with decoder $18_{(1)}$ is used as an example. Row $R_{(7)}$ is selected when set clock pulse $\phi_1$ occurs, causing the following.

1. The address signals $A_4$–$A_8$ select decoder $18_{(1)}$ among the thirty two (32) decoders $18_{(1)}$–$18_{(32)}$. In other words, for the selected decoder $18_{(1)}$, the address signals applied to the bases of transistors Q5 through Q9 respectively are all low. Node E is pulled down by Q4 because transistors Q5–Q9 remain off. Since the potential (Vb3) at the base of Q1 is larger than the potential at the base of Q2, current is steered through Q1 instead of Q2.
2. The address signals $A_1$–$A_3$, causes the seventh output of predecoder 22 coupled to the base of $QR_7$ to go true (high) and $QR_7$ is turned on. For the selected row $R_{(7)}$, a current path is established. Current is steered from the current source through the first differential transistor Q1, the current steering node C, the emitter-collector path of $QR_7$, through resistor R3 associated with $R_7$ to the power supply Vcc. As a result, the potential at node $F_{(7)}$ is pulled down, indicating the selection of the row. In a preferred embodiment, selected node $F_{(7)}$ is pulled down to approximately two (2) volts below Vcc. In the preferred embodiment, Vcc=5.0 volts.

3. The delayed set (low) dummy bit from the disable circuit 24 arrives at the decoder 18$_{(1)}$ and shuts off Q10 at approximately the same time the outputs of the decoder 18$_{(1)}$ and the predecoder 22 become valid. As a result, the current from the current source (Q3 and R1) is steered in the above-defined path.

It is useful to note why the other rows associated with decoder 18$_{(1)}$ are not selected. The remaining row select transistors QR$_1$–QR$_6$6, and QR$_8$ are not activated by predecoder 22. Thus, the aforementioned current path for these rows is not established and switching nodes F$_{(1)}$–F$_{(6)}$, and F$_{(8)}$ remain high.

It is also useful to note the operation of the decoder circuit 18 when it is not selected. If one or more of the inputs A$_4$–A$_8$ is high, the corresponding transistors Q9–Q5 respectively is/are turned on. As a result, node E is pulled up toward Vcc. Since the potential at node E is larger than Vb3, current is steered through Q2 instead of Q1, and a row associated with the decoder cannot be selected.

In an alternative embodiment, the decoder circuit 18 is slightly simplified. This simplification is accomplished by the removal of transistors Q2, Q4 and R2 from the decoder circuit 18. The emitters of Q5–Q9 are coupled directly to node D. Such an embodiment operates in the same manner as the decoder shown in FIG. 3.

The Driver Circuit

Figure 4:
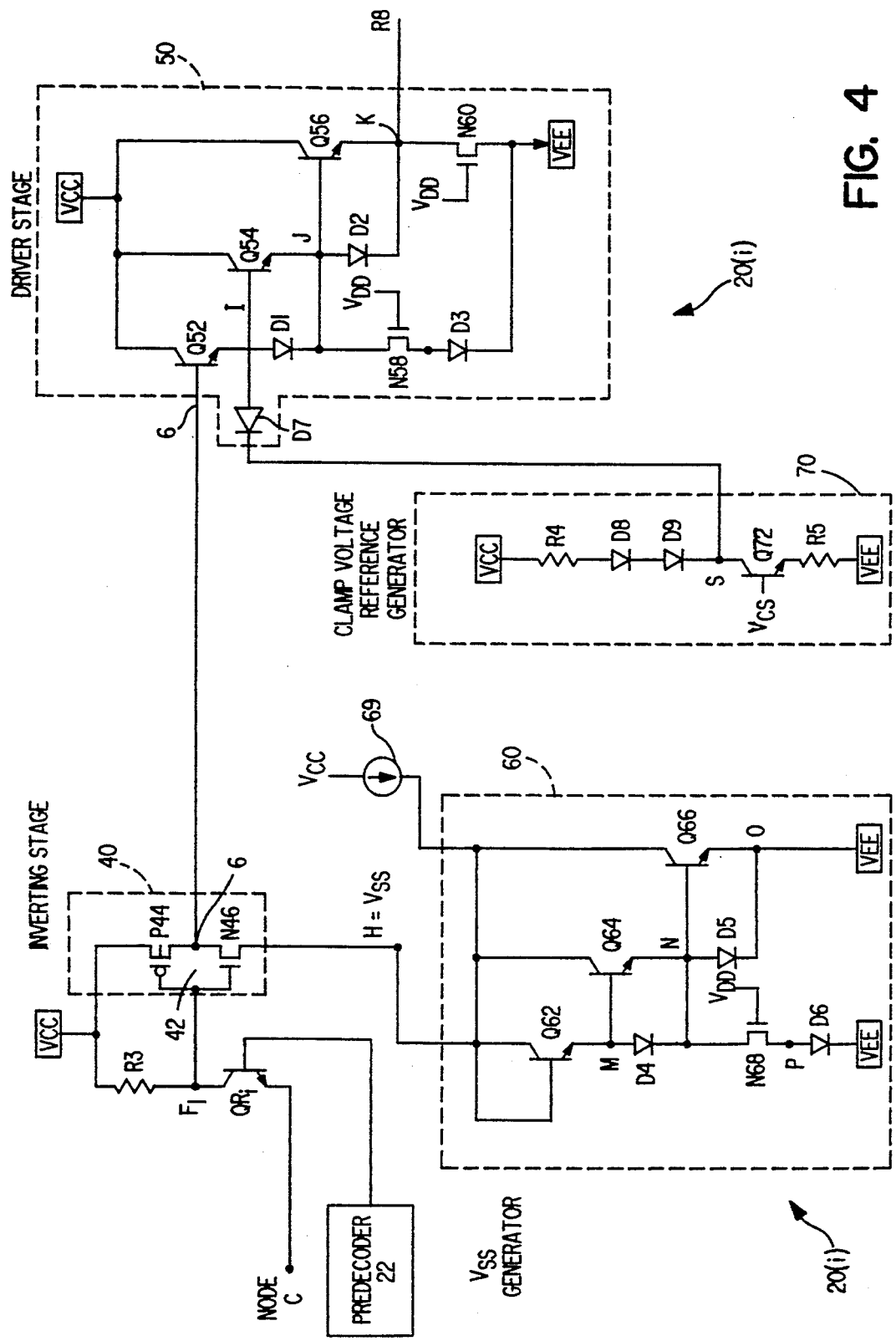
FIG. 4 illustrates a schematic of the driver circuit of the present invention.

Referring to FIG. 4, a schematic of the driver circuit 20$_{(i)}$ of the present invention is shown. Each driver circuit 20$_{(i)}$ includes an inverter stage 40, a driver stage 50, a Vss generator 60 and a clamp voltage reference generator 70.

The inverter stage 40 includes inverter 42 including PMOS transistor P44 and NMOS transistor N46. The gate of P44 is coupled to row select node F$_{(i)}$, and its source-drain current path is coupled between Vcc and node G. The gate of N46 is coupled to row switching node F$_{(i)}$, and its source-drain current path is coupled between node G and node H. The output node G swings between Vcc and Vss. In a preferred embodiment, Vss is approximately 1.7 volts.

The driver stage 50 includes bipolar transistor Q52, bipolar transistor Q54, and bipolar transistor Q56 arranged in a cascaded triple emitter-follower configuration, diode D1, diode D2, diode D3, and clamp diode D7, NMOS transistor N58 and NMOS transistor N60. The base of transistor Q52 is coupled to node G, the emitter is coupled to node I, and the collector is coupled to Vcc. The base of transistor Q54 is coupled to node I, the emitter is coupled to node J and the collector is coupled to node Vcc. The base of transistor Q56 is coupled to node J, the emitter is coupled to row R$_i$ at node K, and the collector is coupled to Vcc. D1 is coupled between nodes I and J. D2 is coupled between nodes J and K. D3 is coupled between node L and Vee. Clamp diode D7 is coupled between node I and the clamp reference voltage circuit 70. The gate on N58 is coupled to Vdd, and the source-drain current path is coupled between node J and node L. The gate on N60 is coupled to Vdd, and the source-drain current path is coupled between node K and Vee.

The Vss generator 60 includes bipolar transistor Q62, bipolar transistor Q64, and bipolar transistor Q66 arranged in a triple emitter-follower configuration, diode D4, diode D5, and D6, and NMOS transistor Q68 and current source 69. Transistors Q62, Q64, and Q66, and diodes D4, D5, and D6 are matched in size and orientation with transistors Q52, Q54, and Q56 and diodes D1, D2, and D3 of driver stage 50 respectively.

The base and collector of transistor Q62 are coupled to node H, and the emitter is coupled to node M. The base of transistor Q64 is coupled to node M, the emitter is coupled to node N and the collector is coupled to node H. The base of transistor Q66 is coupled to node N, the emitter is coupled to Vee, and the collector is coupled to node H. D4 is coupled between nodes M and N. D5 is coupled between node N and Vee. D6 is coupled between node P and Vee. The gate on N68 is coupled to Vdd, and the source-drain current path is coupled between node N and node P. A current source 69 is coupled between Vcc and node H. In a preferred embodiment, the current source 69 is used to generate and set the current in Vss generator 60. Since the voltage between Vcc and node H is relatively large, a simple current source such as a resistor is sufficient. In other applications, a more precise current source using a transiston may be used.

The clamp voltage reference generator 70 includes bipolar transistor Q72, diode D8, and diode D9, and resistors R4 and R5. The base of transistor Q72 is coupled to Vcs, and the collector is coupled to node S, and the emitter is coupled to Vee through R5. D8, D9 and R4 are coupled in series between Vcc and node S. The reference voltage generated at node S is approximately equal to the voltage drop across D8, D9 and R4 below Vcc.

Operation of the driver circuit when the row R$_{(i)}$ is selected is now described. As previously noted, switching node F$_{(i)}$, is pulled down (approximately 2.0 volts) when row R$_{(i)}$ is selected. The stage 40 receives the row select signal at node F$_{(i)}$, and inverts it at node G. The low signal at node F$_{(i)}$ turns on P44. Node G is thus pulled up to Vcc, completing the inversion.

The driver stage 50 is responsible for receiving, amplifying and translating the inverted row select signal and driving the selected row R$_{(i)}$. The Vcc potential at node G turns on Q52, pulling up node I, which in turn turns on Q54, which pulls up node J, which finally turns on Q56, pulling up node K. Since Q52, Q54 and Q56 are arranged in a triple emitter-follower configuration, the current at node G is greatly amplified and the output node K is translated (with respect to Vcc) to the appropriate voltage necessary to drive the selected row R$_{(i)}$. Transistor N60 acts as a current source. The generation of large amounts of current at node K enables the pull up of of the selected row R$_{(i)}$ to occur much faster than previously possible with prior art driver circuits. Accordingly, the access of a memory cell or cells on the row occurs much faster than previously possible.

In addition to the exceptionally fast access times, the driver stage 50 also has a number of other innovative features. These features include tailoring the amount of current gain of the circuit, making the current gain of the circuit process independent, eliminating overshoot of the circuit, and providing a current source which automatically shuts off when the row is deselected, thereby minimizing power consumption at the deselected row.

The driver stage can be tailored to control the amount of current amplification used to drive the row at node K. The amount of current gain (beta) at the first stage Q52 of the triple emitter follower configuration is process dependent. The gain at the second stage (Q54 and D1) and the third stage (Q56 and D2), is, however, selectively controllable. For example, the gain of the second stage is determined by the effective emitter area of the diode D1 plus the effective emitter area of the transistor Q54 divided by the effective emitter area of the diode D1. The gain of the third stage is defined by the same relationship between diode D2 and Q56. In the preferred embodiment, the gain of the first stage is approximately one hundred. (100), second stage is six (6) and the third stage is nine (9). It is useful to note that the gain of the second and third stages are process independent. In other words, the gain ratio between stage two and stage three will remain relatively constant from one wafer run to the next, regardless of whether process variations would otherwise cause the gain (beta) of the individual transistors to be different from one wafer run to the next.

The effective inductance present in the triple emitter-follower configuration of the driver stage 50 creates a problem of voltage overshoot. To alleviate this problem, the driver stage makes clever use of the clamp diode D7 and dimes D1 and D2. When the voltage at node I exceeds the turn on voltage of D7 above the voltage reference established by the clamp voltage reference generator 70, the excess current is shunted through Q72 to Vee, thereby eliminating the voltage overshoot at node I. In a similar manner, diodes D1 and D2 prevent overshoot by reducing the DC current gain of Q54 and Q56 at nodes J and K respectively. Since the clamp diode remains off during normal conditions, no current is shunted away from the driver circuit 50. Thus the overshoot problem normally associated with cascaded emitter follower transistors is virtually eliminated without decreasing the speed performance of the driver circuit 50.

The driver circuit 20 is also advantageously designed to reduce power consumption during row deselect. For a deselected row $R_{(i)}$, the switching node $F_{(i)}$ remains at a high potential. The output of the inverter stage 40 at node G is therefore at Vss. The Vss voltage, when applied to the driver stage 70, is reduced a diode drop per transistor Q52, Q54 and Q56 respectively. The net effect is that at node K, the voltage is approximately equal to zero.

During row deselect, the the row discharge path through transistor N60 dissipates negligible power because node K is essentially at Vee. In addition, N60 provides pull down current through D1 and D2 to help discharge nodes I and J. Similarly, transistor N58 and diode D3 perform the same functions at node I and J.

The Vss generator 60, with its matched components, is a current mirror with the driver stage 50 with respect to Vee. The current mirror ensures that the current dissipation at node K of a deselected row remains at approximately zero, even in the event of process, temperature, voltage or other variations.

Lastly, the clamping diode D7 is inactive during row deselect and therefore dissipates no power. This also significantly reduces the power consumption of the memory array.

The aforementioned features of the driver circuit render the direct current power dissipation at node K negligible. The amount of power consumed by each deselected row is substantially less than prior art driver circuits. Accordingly, for a given power budget, a much larger memory array can be used.

In a preferred embodiment, a plurality of rows may share a single Vss generator circuit 60 and a single clamp voltage reference generator circuit 70. For example, a single Vss generator circuit 60 and a single clamp voltage reference generator circuit 70 may service four (4) separate rows.

Figure 5:
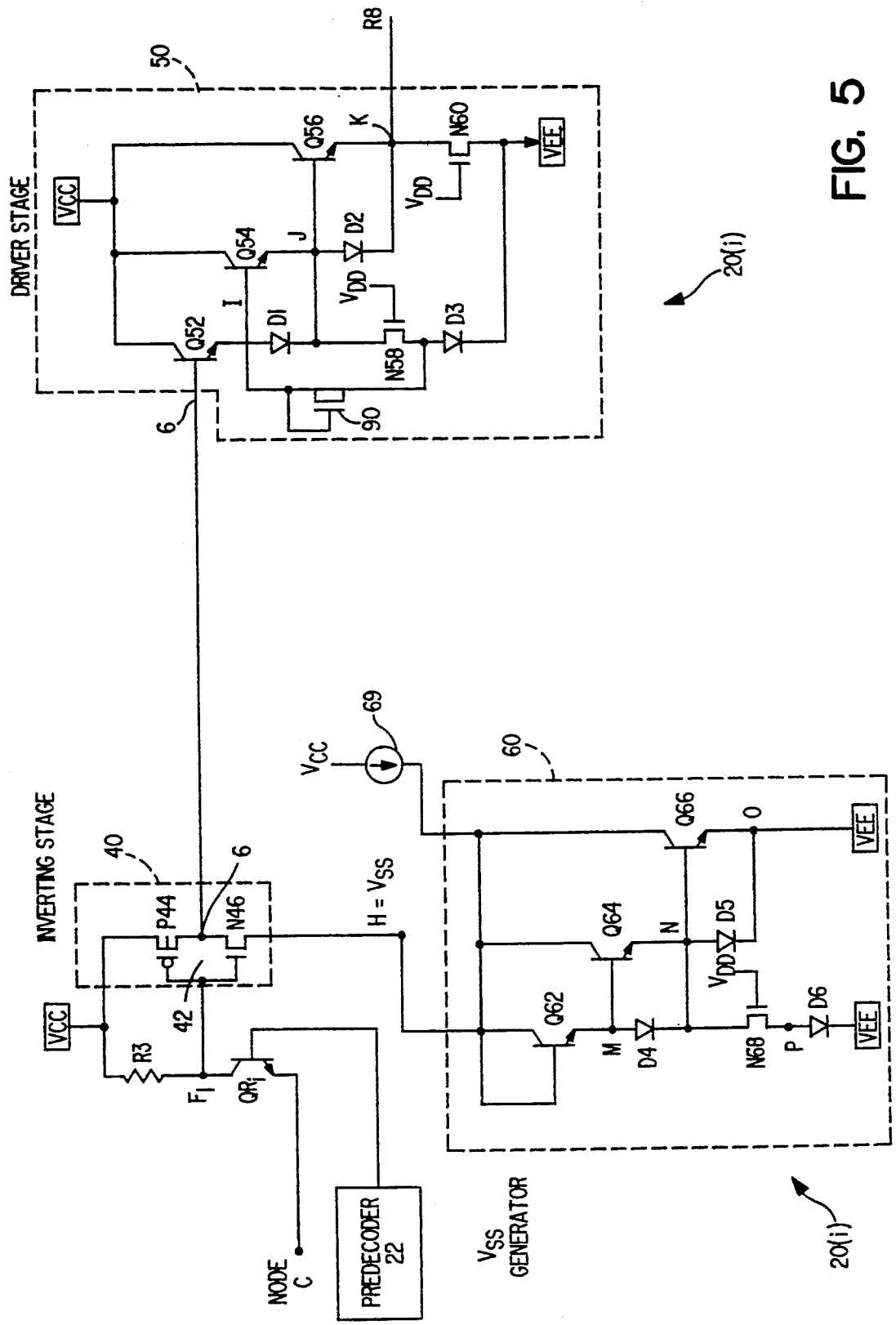
FIG. 5 illustrates a schematic of the driver circuit according to a second embodiment of the present invention.

Referring to FIG. 5, an alternative embodiment of the present invention is shown. This embodiment includes a clamping field effect transistor (FET) 90 used in place of the clamping diode D7. The FET 90 is not susceptible to reverse breakdown. Use of the FET 90 also eliminates the need to use the clamp voltage reference generator 70. The operation of the driver circuit 20(i) of FIG. 5 is essentially identical to that described above with respect to FIG. 4.

While the present invention has been described in relationship to the embodiments described in the accompanying specification, other alternatives, embodiments and modifications will be apparent to one skilled in the art. For example, the row select circuit of the present invention can be scaled for any size memory. It is intended that the specification be only exemplary, and that the true scope and spirit of the invention be indicated by the following claims.

What is claimed is:

1. A semiconductor memory circuit, comprising:
   a multiplicity of rows;
   a row decoder circuit for selecting one of the multiplicity of rows; and
   a differential pair including a current source, a first transistor and a second transistor, coupled between the row decoder and the multiplicity of rows, the differential pair for providing current from the current source to the selected one of the multiplicity of rows.

2. The circuit of claim 1, wherein in the event one of the multiplicity of rows is selected, current from the constant current source is switched from the current source to the selected row.

3. The circuit of claim 1, wherein the row decoder includes a decoder logic circuit coupled to the second transistor of the differential pair.

4. The circuit of claim 3, wherein a voltage reference is coupled to a control electrode of the first transistor and the decoder logic circuit is coupled to a control electrode of the second transistor of the differential pair.

5. The circuit of claim 1, wherein each of the multiplicity of rows further comprises a row select node and a pull up resistor.

6. The circuit of claim 5, wherein each of the multiplicity of rows further comprises a row select transistor.

7. The circuit of claim 6, wherein in the event a row in the decoder circuit is selected, current from the current source is switched through the row select transistor and the pull up resistor, thereby pulling down the row select node for the selected row.

8. The circuit of claim 7, wherein each of the multiplicity of rows includes an inverter and a driver circuit coupled to the switching node.

9. The circuit of claim 1, further comprising a predecoder for selecting one of the multiplicity of rows.

10. The circuit of claim 2, wherein in the event the decoder circuit is deselected, a current path is established between the current source and the second transistor of the differential pair to a power source.

11. A driver circuit on a semiconductor memory, comprising:
   an input node coupled to receive a row select signal,
   a driver stage for amplifying the row select signal;

a switching clamp, coupled to the driver stage, for reducing the effects of overshoot in the driver stage;

an output node for outputting the amplified row select signal; and a row coupled to the output node and being selected in response to the amplified row select signal.

12. The circuit of claim 11, wherein the amplifier stage comprises a plurality of transistors arranged in a cascaded emitter-follower configuration for amplifying the current of the row select signal.

13. The circuit of claim 11, wherein the amplifier stage comprises three cascaded emitter-follower transistors.

14. The circuit of claim 11, wherein the switching clamp is switched on when a predetermined voltage at the amplifier stage is exceeded, thereby minimizing the effect of overshoot in the amplifier stage by shunting current away from the amplifier stage.

15. The circuit of claim 11, wherein current gain of the amplifier stage is selectively controlled.

16. The circuit of claim 15, wherein the gain of the amplifier stage is selectively controlled by varying the effective emitter size of a transistor and a diode respectively associated with the amplifier stage.

17. The circuit of claim 16, wherein the gain of the amplifier stage is process independent.

18. The circuit of claim 11, wherein the amplifier stage includes a discharge path which acts as a current source during row drive operation of the amplifier stage.

19. The circuit of claim 18, wherein the current source of the discharge path is automatically shut off when the row associated with the driver stage is deselected.

20. The circuit of claim 11, further comprising an inverter stage, coupled to invert the row select signal and to provide the inverted row select signal to the input node of the driver stage.

21. The circuit of claim 20, wherein the inverter stage inverts and translates the row select signal operating in a first voltage range to the inverted row select signal operating in a second voltage range.

22. A circuit on a semiconductor memory, comprising:

a translating stage for receiving a deselect signal at a first voltage and translating it to a second voltage;

a row;

a driver stage coupled between the translating stage and the row, wherein the driver stage has a voltage drop approximately equal to the second voltage and;

a current mirror coupled to the driver stage.

23. The circuit of claim 22, further comprising a voltage reference circuit coupled to the translating stage for establishing the second voltage.

24. The circuit of claim 22, wherein the current mirror includes a plurality of transistors arranged in a cascaded emitter-follower configuration.

25. The circuit of claim 22, wherein the driver stage includes a plurality of transistors arranged in a cascaded emitter-follower configuration.

26. The circuit of claim 22, wherein the voltage at the row is approximately zero.

27. A method of driving a selected row in a memory array, comprising the steps of:

receiving a signal at an input node of an amplifying stage;

amplifying, in a series of cascaded amplifier stages, the row select signal;

pulling up an output node, coupled to a selected row in a memory array, in response to the amplified row select signal; and in the event of voltage overshoot conditions in the cascaded amplifier stages, turning on a clamp to shunt excess current away from the cascaded amplifier stages.

28. The method of claim 27, further comprising the step of inverting the signal before the step of receiving the signal at the input node of the amplifier stage.

29. The method of claim 27, wherein the amplifying step includes the step of increasing the current gain of the signal.

30. The method of claim 27, wherein the amplifying step further comprises the step of amplifying the row select signal through a plurality of transistors arranged in an emitter-follower configuration.

31. The method of claim 27, further comprising the step of discharging the output node after the selected row has been selected.

32. A method of reducing power consumption of a deselected row in a memory array, comprising the steps of:

receiving a row deselect signal at a first predetermined voltage;

translating the row deselect signal to a second predetermined voltage;

applying the translated row select signal at the second predetermined voltage at an input node of a driver circuit having a voltage drop approximately equal to the second predetermined voltage;

outputting the row deselect signal at an output node of the driver circuit and;

providing a current mirror to substantially minimize any current from being dissipated at the output node.

33. The method of claim 32, wherein the first predetermined voltage is established by a reference voltage circuit.

34. A row driver circuit on a semiconductor memory, comprising:

an input node for receiving either a row select or a row deselect signal;

a translator for translating the row select signal or the row deselect signal;

an amplifier stage for amplifying the translated row select signal, or reducing the potential of the row deselect signal for minimizing power dissipation of the amplifier stage in response to the row deselect signal;

a clamp, coupled to the amplifier stage, for reducing the effect of overshoot in the amplifier stage in response to the row select signal;

a row coupled to the output of the amplifier stage and selected in response to the row select signal or deselected in response to the row deselect signal.

* * * * *